(12) United States Patent
Gattani

(10) Patent No.: US 6,229,466 B1
(45) Date of Patent: May 8, 2001

(54) DIGITAL CALIBRATION METHOD AND APPARATUS FOR MULTI-BIT DELTA-SIGMA D/A CONVERTER

(75) Inventor: Amit Gattani, Tinton Falls, NJ (US)

(73) Assignee: Level One Communications, Inc., Sacramento, CA (US)

( * ) Notice: Subject to any disclaimer, the term of this patent is extended or adjusted under 35 U.S.C. 154(b) by 0 days.

(21) Appl. No.: 09/378,852

(22) Filed: Aug. 23, 1999

(51) Int. Cl.[7] .............................. H03M 1/10; H03M 3/00
(52) U.S. Cl. ............................. 341/120; 341/143
(58) Field of Search .................... 341/118, 120, 341/139, 143, 145

(56) References Cited

U.S. PATENT DOCUMENTS

| | | |
|---|---|---|
| 4,937,842 | 6/1990 | Howell . |
| 5,087,914 * | 2/1992 | Sooch et al. ................... 341/120 |
| 5,257,026 | 10/1993 | Thompson et al. . |
| 5,305,004 | 4/1994 | Fattaruso . |
| 5,517,249 | 5/1996 | Rodriquez-Cavazos et al. . |
| 5,583,501 | 12/1996 | Henrion et al. . |
| 6,037,888 * | 3/2000 | Nairn ................................ 341/145 |
| 6,114,981 * | 9/2000 | Nagata ............................. 341/143 |

OTHER PUBLICATIONS

"An Overview of Basic Concepts"; J.C. Candy; *Delta-Sigma Data ConvertersTheory, Design, and Simulation*; Ch. 1, pp.1–13.

"Linearity Enhancement of Multibit$\Delta\Sigma$ A/D and D/A Converters Using Data Weighted Averaging"; *IEEE Transactions on Circuits and Systems—II: Analog and Digital Signal Processing*, vol. 42, No. 12, Dec. 1995; pp. 753–762.

"A High Resolution Multibit Sigma–Delta Modulator with Individual Level Averaging"; *IEEE Journal of Solid–State Circuits*, vol. 30, No. 4, Apr. 1995; pp. 453–460.

"Digitally Corrected Mult–Bit $\Sigma\Delta$ Data Converters"; T. Cataltepe et al.; Electrical Engineering Department, UCLA; 1989; pp. 647–650.

* cited by examiner

Primary Examiner—Patrick Wamscey
(74) Attorney, Agent, or Firm—Altera Law Group, LLC

(57) ABSTRACT

A system and method for calibrating a multi-bit feedback quantizer in a delta-sigma modulation system. A digital data pattern corresponding to a particular DAC code of a multi-bit digital-to-analog converter is transmitted in the transmit channel, where the DAC code is proportional to an analog voltage signal. An effective DC component of the digital data pattern is realized and converted to corresponding digital DC component values. A predetermined number of samples of the digital DC component values are averaged to provide an average sample value. A digital code in the multi-bit feedback quantizer is replaced with the average sample value.

21 Claims, 5 Drawing Sheets

DIGITAL CALIBRATION METHOD AND APPARATUS FOR MULTI-BIT DELTA-SIGMA D/A CONVERTER

BACKGROUND OF THE INVENTION

1. Field of the Invention.

This invention relates in general to telecommunications, and more particularly to a method and apparatus for calibrating a Δ-Σ modulator quantizer to substantially replicate relative mismatches in the multi-bit digital-to-analog converter in the transmit channel of the modulation system.

2. Description of Related Art.

Global communications continues to demonstrate rapid growth rates. As more people become accustomed to the convenience of electronic mail, web-based facsimile transmission, electronic commerce, telecommuting and high-speed Internet access, the demand on the telecommunications industry to provide adequate bandwidth to provide this type of service also increases. The growth in the number of people using electronic communications will only increase as the price of Internet access and Internet access devices such as personal digital assistants (PDAs), computers, etc. decreases.

Today, copper telephone lines service almost all voice traffic and most of the Internet traffic. However, as content rich applications continue to grow, both public and private copper access networks are being challenged. The local portion of the enterprise becomes a major challenge for access providers. To take advantage of the increasingly popular innovations in telecommunications technology, additional telephone lines are being installed in private residences and businesses.

Although analog modems have managed to stretch their potential speed to 56 kilobits per second (kbps), small-office/home-office (SOHO) customers need far greater Internet bandwidth to accommodate multimedia applications ranging form three-dimensional web sites to video conferencing. Analog modems cannot deliver the necessary bandwidth and, therefore, have reached the end of their usefulness.

In response to these developments, communications companies are responding with a variety of digital access solutions, all variants of Digital Subscriber Line (DSL) technology. These DSL technologies differ dramatically in their abilities to address major SOHO applications and the requirements of telephone companies.

DSL technologies are transport mechanisms for delivering high-bandwidth digital data services via twisted-pair copper wires. These copper wires provide the cabling between the telephone company's central offices and subscribers. DSL technology is a copper loop transmission technology that solves the bottleneck problem often associated with the last mile between Network Service Providers and the users of those network services. DSL technology achieves broadband speeds over ordinary phone wire. While DSL technology offers dramatic speed improvements (up to 7+Mbps) compared to other network access methods, the real strength of DSL-based services lies in the opportunities driven by multimedia applications required by today's network users, performance and reliability and economics.

Without such transport mechanisms, subscribers would have to rely on $T_1$ (1.5 Mbps) or E1 (2.0 Mbps) service, which requires the phone company to install expensive new cabling to every location that wants high-speed digital service. The installation costs make T1/E1 service expensive.

The original DSL service was ISDN DSL (ISDL), which was defined in the late 1980s. ISDL provides 160 kbps rates over a single twisted-pair at ranges up to 18,000 feet from the telephone company's central office. While this service has been deployed in many homes and small businesses around the world, the demands of multimedia applications are already challenging IDSL's bandwidth.

Asymmetric Digital Service Line (ADSL) is currently being embraced by residential web surfers for its ability to quickly download music and video files. ADSL refers to modem technology that transforms twisted copper pair (ordinary phone lines) into a pipeline for ultra fast Internet access. As the name suggests, ADSL is not asynchronous transmission, but rather asymmetric digital transmission, i.e., ADSL transmits more than 6 Mbps (optionally up to 8 Mbps) to a subscriber, and as much as 640 kbps (optionally up to 1 Mbps) in the other direction.

ADSL has the ability to increase normal phone line capacity by 99% via a digital coding technique. This extra capacity means that one could simultaneously assess the World Wide Web and use the telephone or send a fax. A user of this technology could have uninterrupted Internet access that is always on-line. This technology also has the potential to be a cost-effective solution for residential customers, telecommuters and small business.

Still, there is a need for symmetric high-speed connection. For example, small businesses have become increasingly dependent on sophisticated voice and data products and services for competing against larger corporations. Until now, the cost of providing small businesses with professional telephony and data services was prohibitive. However, integrated access and virtual public branch exchanges (PBXs) are providing small businesses with voice mail, high-speed Internet access, multiple business lines and sufficient capabilities for telecommuters.

As mentioned above, symmetric services were traditionally delivered by T1 and E1 lines. Within the DSL family, HDSL has long been used to provision $T_1$ lines because its long reach requires regeneration-signal boosting only every 12,000 feet, compared with every 4,000 feet for other T1 provisioning techniques. In fact, HDSL's ability to simplify and cheapen T1 deployment has made HDSL by far the most established of the DSL technology family.

As an inexpensive and flexible replacement for leased $T_1$ lines, the HDSL2 standards are eagerly awaited by the DSL industry. HDSL2 replaces the aging HDSL standard that required two copper pairs. HDSL2 uses only one copper pair and is potentially rate adjustable. HDSL2, which is being developed within the framework of the American National Standards Institute (ANSI, New York), promises to make HDSL more compelling in two ways. While HDSL was a proprietary technique, i.e., modems at the central office (CO) and the customer premises had to come from the same vendor, HDSL2 will be an interoperable standard in which modems can be mixed. Perhaps the biggest selling point of HDSL2, however, is that it can use one pair of copper wires instead of HDSL's two. Network service providers thus have a choice. HDSL and one-pair HDSL2 have about the same reach, while two-pair HDSL2 adds as much as another 4,000 feet of reach, depending on the gauge of copper and other conditions. Hoping to propel the new DSL technology into the business arena, eight chip makers and OEMs have formed a consortium for the HDSL2 standard.

A typical HDSL2 transceiver transmit path includes a framer, a data pump with an analog interface for coupling to the twisted-pair line. In the transmit function, the framer accepts a digital signal and outputs to the data pump a serial digital signal that includes the data payload plus an HDSL2 overhead. In the receive function, the framer receives HDSL frames from the data pump.

The data pump includes a transceiver and an analog front end for receiving the HDSL frames serially from the framer. The transceiver converts the HDSL frames into a transmit signal by first converting the HDSL frames into symbols. Typically, a modulator, such as a trellis code modulator (TCM) encodes the symbols into a pulse amplitude modulation (PAM) signal. The signal is further processed to condition and filter the PAM signal. The analog front end provides pulse shaping to analog signals. This process is reversed in the receive channel with echo cancellation provided to cancel most of the echoed transmit signal.

As mentioned, the analog front end includes a transmit and a receive channel. In the transmit channel, the analog front end receives a pulse width modulated signal stream from the transceiver. A switched capacitor circuit filter shapes the transmitted signal to meet specific spectral templates. The receive channel consists of an automatic gain control (AGC) stage and an analog-to-digital (A/D) converter. The AGC stage sets the amplitude to the optimum level to prevent saturation of the A/D converter.

The electronic equipment and communications systems taking advantage of HDSL2 technology may also benefit from the use of effective modulation techniques. Delta-sigma ($\Delta$-$\Sigma$) modulation uses the concept of oversampling and digital signal processing to achieve a high degree of accuracy in analog-to-digital (A/D) and digital-to-analog (D/A) conversion. One advantage that $\Delta$-$\Sigma$ data converters offer is that they allow implementation of very high precision A/D and D/A converters without requiring stringent matching of fabricated components. This is accomplished by trading resolution for data processing speed—by sampling the data at much higher frequency than the frequency of the signal (referred to as oversampling ratio). This technique pushes the effects of low resolution components into high frequency noise band.

As the bandwidth of the signal increases, it becomes difficult to maintain a high oversampling ratio because digital and analog signal processing must be performed at very high clock frequencies. Higher clock frequency operation is sometimes technology-limited, and may lead to higher circuit power consumption.

One way to achieve a comparable level of performance from $\Delta$-$\Sigma$ modulators at lower oversampling ratios is to reduce the amount of quantization error in the feedback. This may be performed using a multi-bit feedback D/A converter (DAC) in the modulator loop. The reduction in the signal-to-noise (S/N) ratio due to reducing the oversampling ratio can be compensated for by contemporaneously reducing the quantization error in the feedback loop. This technique becomes very attractive for wide band communication signal.

However, a large part of the appeal of $\Delta$-$\Sigma$ modulators is the use of single bit quantizer, which is linear by design. When a multi-bit quantizer is introduced, it must be linear at least to the level of linearity required in the overall system. In an A/D converter (ADC) implementation, the quantizer is implemented in the analog feedback loop of the modulator. In a DAC implementation, the actual modulator feedback quantizer is digital, and following the modulator a quantizer is implemented as an analog DAC followed by analog noise filters.

In high-linearity DAC applications where a multi-bit $\Delta$-$\Sigma$ modulator will be used, the multi-bit analog DAC will have limited linearity based on analog component matching. These analog mismatches can be corrected by traditional randomization techniques on the analog component to average out and minimize mismatch effects, or by the trimming of analog components, which is expensive and undesirable.

If these analog non-linearities can be replicated in the digital quantizer of the $\Delta$-$\Sigma$ modulator loop, the effect of these nonlinearities can be eliminated and the overall system will behave as if it has ideal digital and analog DACs. It would be desirable to have a digital calibration technique for the digital feedback quantizer to allow precise replication of the analog nonlinearities in the digital quantizer.

It can be seen then that there is a need for a method and apparatus for calibrating a $\Delta$-$\Sigma$ modulator quantizer to substantially replicate relative mismatches in the multi-bit digital-to-analog converter in the transmit channel of the modulator. The present invention provides a solution to these and other shortcomings of the prior art, and offers additional advantages over the prior art.

SUMMARY OF THE INVENTION

To overcome the limitations in the prior art described above, and to overcome other limitations that will become apparent upon reading and understanding the present specification, the present invention discloses a method and apparatus for calibrating multi-bit digital-to-analog converters, and more particularly, provides a method and apparatus for calibrating a $\Delta$-$\Sigma$ modulator quantizer to substantially replicate relative mismatches in the multi-bit digital-to-analog converter in the transmit channel of the modulator.

In accordance with one embodiment of the invention, a method is provided for calibrating a multi-bit feedback quantizer in a delta-sigma modulation system used to transmit analog signals in a transmit channel. A digital data pattern corresponding to a particular DAC code of a multi-bit digital-to-analog converter is transmitted in the transmit channel, where the DAC code is proportional to an analog voltage signal. An effective DC component of the digital data pattern is realized and converted to corresponding digital DC component values. A predetermined number of samples of the digital DC component values are averaged to provide an average sample value. A digital code in the multi-bit feedback quantizer is replaced with the average sample value.

In accordance with another aspect of the invention, a calibration apparatus is provided for calibrating a multi-bit digital delta-sigma modulator having a multi-bit feedback quantizer in the modulation loop. The apparatus includes a multi-bit digital-to-analog converter having associated DAC codes proportional to an analog voltage signal. A calibration data pattern generator generates a unique digital data pattern of codes having an analog DC component representative of each of the DAC codes. An analog-to-digital converter is coupled to the multi-bit digital-to-analog converter to convert the analog DC component to a corresponding digital DC component value, where the digital DC component value replaces a digital code in the multi-bit feedback quantizer with the digital DC component value. The analog DC component derived from the digital data pattern of codes is proportional to the analog voltage signals of its corresponding DAC code, and has a constant gain factor across all DAC codes of less than one.

These and various other advantages and features of novelty which characterize the invention are pointed out with particularity in the claims annexed hereto and form a part hereof. However, for a better understanding of the invention and its advantages, reference should be made to the drawings which form a further part hereof, and to accompanying descriptive matter, in which there are illustrated and described specific examples of an apparatus in accordance with the invention.

DETAILED DESCRIPTION OF THE INVENTION

Figure 1:
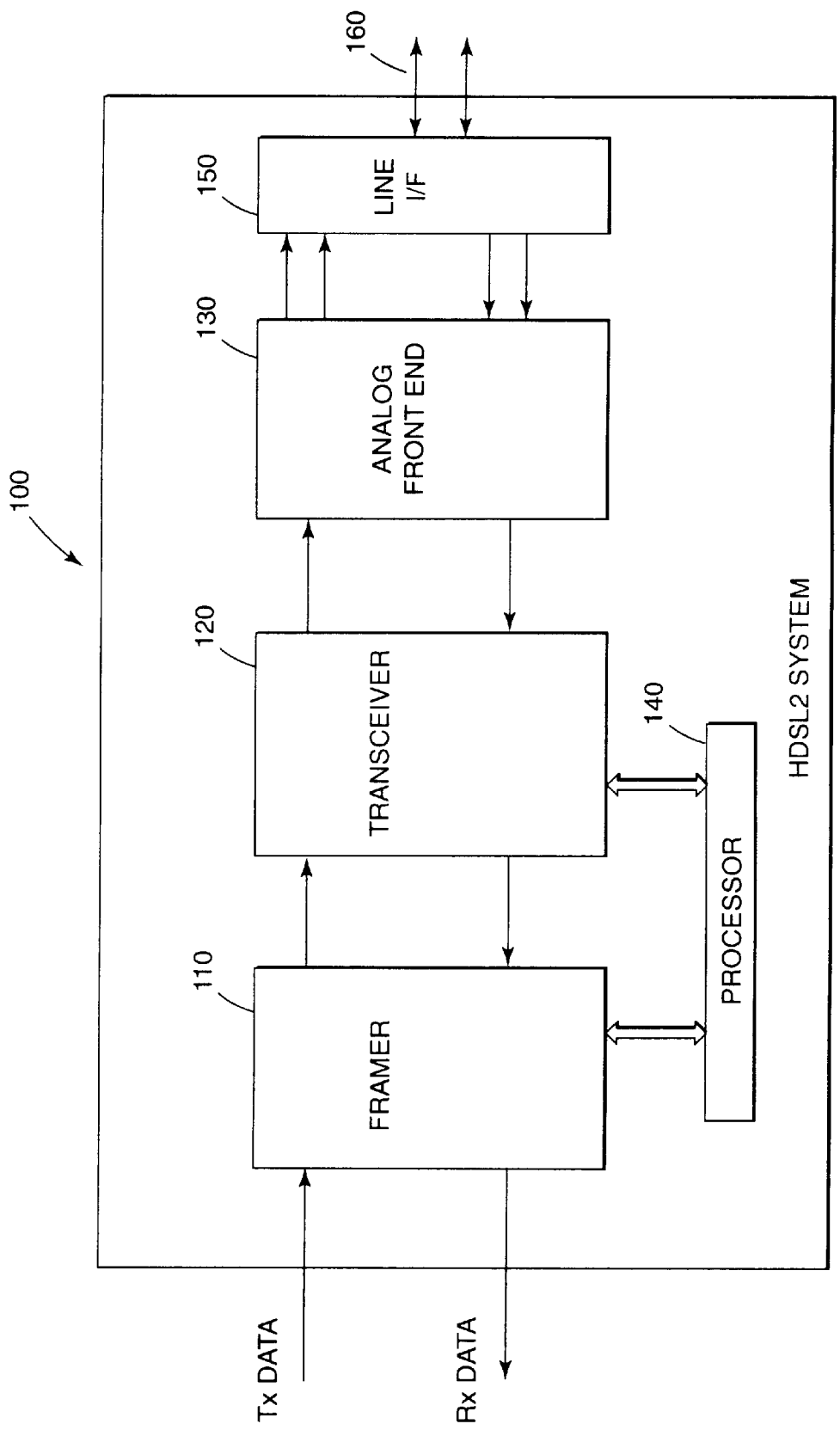
FIG. 1 illustrates a block diagram of one embodiment of an HDSL2 system in which the principles of the present invention may be applied.

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a method and apparatus for calibrating a $\Delta$-$\Sigma$ modulator quantizer to substantially replicate relative mismatches in the multi-bit digital-to-analog converter in the transmit channel of the modulator. A high frequency data pattern is transmitted in place of higher static DC levels to create corresponding lower "effective" DC levels for calibration purposes. This may be desirable where actual static DC levels normally generated by the digital-to-analog converter in the transmit channel will potentially extend beyond the acceptable range of the analog circuitry located at the output side of the digital-to-analog converter. Various digital patterns may be designed that reduce the gain of digital codes associated with the static DC levels to scale the analog output to be within the specification range of transmit circuits and measurement-related analog circuits. The apparatus and methodology of the present invention is applicable in any multi-bit digital-to-analog conversion application. The invention is described, however, in connection with a $\Delta$-$\Sigma$ modulator which may be used in connection with a Digital Subscriber Line (DSL) system, such as an HDSL2 system, due to its particularly beneficial implementation in such a system.

More particularly, a second or higher order multi-bit digital $\Delta$-$\Sigma$ modulator may be used to realize the transmitting digital-to-analog converter. Such a modulator loop is only conditionally stable, over limited range of input voltages, and downstream analog filtering circuits are thus designed to operate at limited peak signal level to maximize the S/R ratio and minimize power consumption. Therefore, the full reference voltage of the analog DAC cannot be passed through the analog filters for purpose of DC measurements and calibration of the digital feedback quantizer. However, calibration of the digital feedback quantizer is desired, in order to correct the nonlinearities inherent in the multi-bit analog DAC. Because the linearity of analog DACs is matching dependent, it will vary from die-to-die. Therefore, to make the digital DAC mimic the analog DAC, the analog DAC levels on the die are measured, and replicated on the digital side. A novel technique method and apparatus is provided for digitally calibrating a multi-bit $\Delta$-$\Sigma$ D/A converter when actual DC DAC levels cannot be directly transmitted for measurement.

Instead of cycling through all DAC DC codes for measurement, certain sampling clock frequency based digital data patterns are passed through the DAC. These patterns are chosen such that they use a particular pair of DAC codes, pairing based on positive and negative symmetry of the codes. The density of positive and negative codes is mixed such that they create an effective DC level, either positive or negative, along with high frequency noise. This high frequency noise is first filtered by transmit noise shaping filters, since it is out-of-band noise just like $\Delta$-$\Sigma$ modulator noise. This signal is further measured by an on-chip high-linearity A/D converter. The remaining high frequency noise is filtered by a decimation filter following this A/D converter, producing a DC level representative of the analog DAC code used in digital pattern. The positive and negative codes can be mixed with each other to produce this effective DAC DC code since the DAC switching technique utilizes the positive difference of the two codes to produce one positive DC level, and the negative difference of the codes to produce the negative DC level.

In order to provide an example of a system configuration in which the present invention is applicable, a description of an HDSL2 system and general HDSL2 circuitry is provided. It should be recognized that the principles of the present invention are applicable in a variety of different technical applications, and the invention is therefore not limited to use in a DSL environment. However, in order to provide an exemplary context for describing the present invention, FIGS. 1 and 2 set forth a brief description of an HDSL2 system and associated components, in which the present invention is particularly useful.

FIG. 1 illustrates a block diagram of one embodiment of an HDSL2 system 100 in which the principles of the present invention may be applied. In FIG. 1, the system 100 includes a framer 110, a transceiver 120, and an analog front end 130. The framer 110 provides frame mapping to convert $T_1$/E1 digital signals to HDSL2 frames. The transceiver 120 provides forward error correction, timing recovery, adaptive equalization, echo cancellation and modulation, e.g., pulse amplitude modulation. The framer 110 and transceiver 120 may be coupled to a processor 140. The analog front end 130 receives the HDSL2 frames in the form of a four-bit digital signal and converts the digital signal to an analog output after providing pulse shaping to shape the analog output signal to meet predetermined spectral templates. The analog front end 130 is coupled to a line interface 150 to interface the output of the analog front end 130 and the transmission medium 160, such as a twisted-pair.

Figure 2:
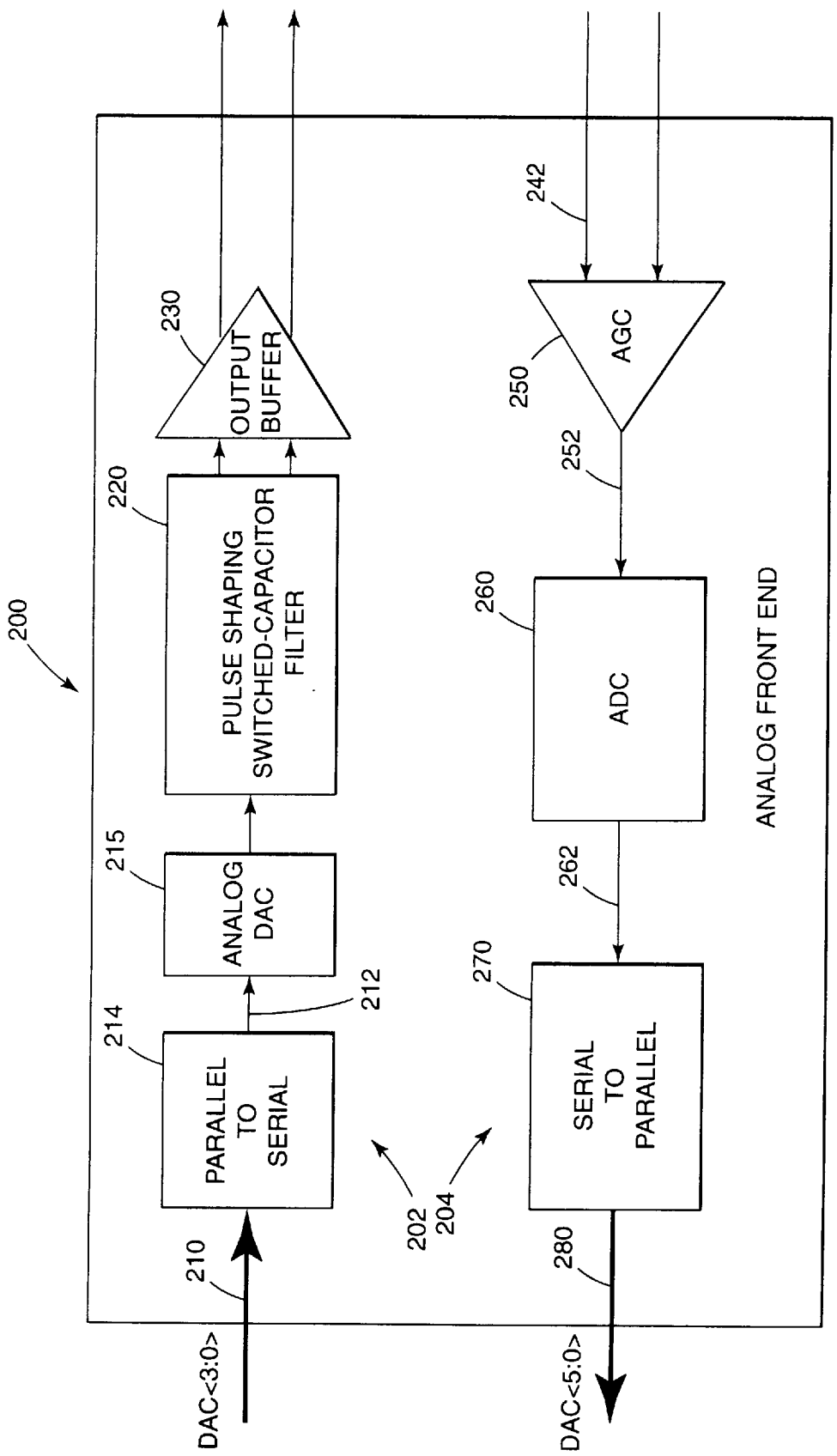
FIG. 2 illustrates a block diagram of an example analog front end of an example HDSL2 system.

FIG. 2 illustrates a block diagram of an example analog front end 200 of the HDSL2 system of FIG. 1. In FIG. 2, the four-bit, parallel digital signal 210 is received and converted to a serial signal 212 via the parallel-to-serial converter 214 in the transmit channel 202, and provided to the analog digital-to-analog converter (DAC) 215 where the signal is converted to digital form In one embodiment, the DAC 215 is a multi-bit DAC, such as a 2-bit DAC. The serial signal is shaped by the switched-capacitor filter 220. An output buffer 230 provides a unity gain, high input impedance, and low distortion, as well as the capability to drive low output impedance.

In the receive channel 204 of the analog front end 200, the analog signals 242 are received and processed by an automatic gain control (AGC) circuit 250. The output 252 from the AGC 250 is provided to an analog-to-digital (A/D) converter 260, e.g. a delta-sigma A/D converter. A serial-to-parallel converter 270 receives the digital signal 262 from the A/D converter 260 and provides a six bit, parallel signal 280 back to the transceiver 120.

Figure 3:
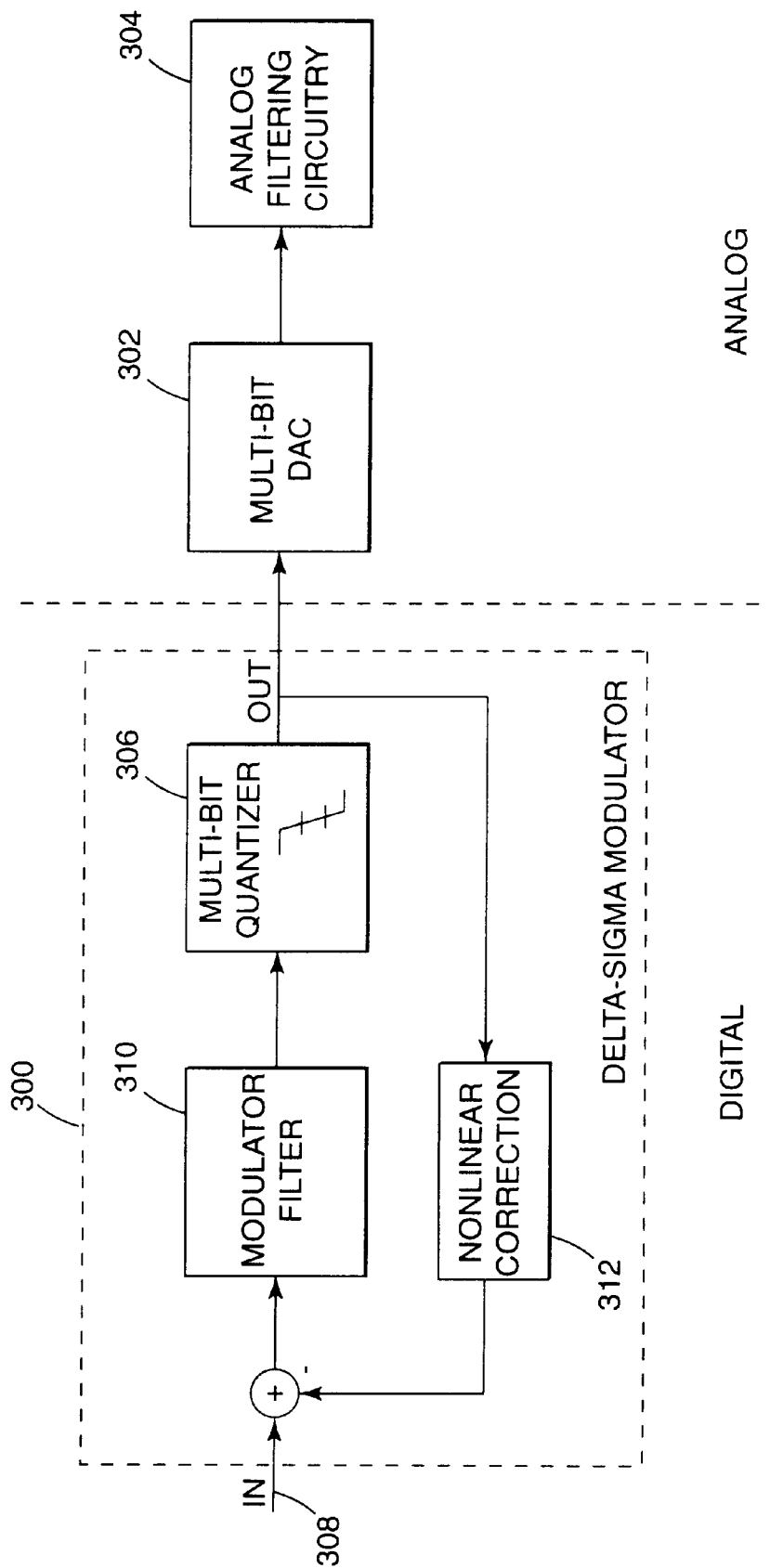
FIG. 3 is a block diagram of a multi-bit digital $\Delta$-$\Sigma$ modulator used to realize the transmit DAC in accordance with the principles of the present invention.

FIG. 3 is a block diagram of a multi-bit digital Δ-Σ modulator 300 used to realize the transmit DAC in accordance with the principles of the present invention. The digital Δ-Σ modulator 300 forms a portion of the digital section of a transceiver transmit path, such as that used in an HDSL2 system. An analog multi-bit DAC 302, which forms a portion of the analog section of the transceiver transmit path, is coupled to the output of the Δ-Σ modulator 300.

The input signal to the Δ-Σ modulator 300 is shown on line 308, and represents the digital data stream to be transmitted. The input signal is filtered by the modulator filter 310, and the filtered signals are provided to the multi-bit quantizer 306 and passed to the analog multi-bit DAC 302. The multi-bit quantizer 306 is essentially a comparator with a multi-bit digital output. The digital output of the multi-bit quantizer 306 is also fed back to the input of the modulator filter 310 via nonlinear correction circuitry 312.

The modulator loop in the Δ-Σ modulator 300 is theoretically only conditionally stable over a limited range of input voltages. For instance, the modulator loop in one embodiment is stable only for input signals that are approximately 60% or less of the peak reference signal in the system. Since the input signals in the system will always be limited by this stability limit, the downstream DAC analog filters 304 are also configured to operate at a limited peak signal level (e.g., 60% of the peak reference signal) in order to maximize the S/R ratio of the system and to minimize power consumption. Therefore, the full reference voltage of the analog multi-bit DAC 302 cannot be passed through the analog filters 304 for the purpose of DC measurements and calibration of the multi-bit quantizer 306. As previously indicated, such a calibration of the quantizer 306 is desirable in order to correct the onlinearities inherent in the multi-bit analog DAC 302.

In one particular embodiment of the Δ-Σ modulator of FIG. 3, a 2-bit feedback quantizer 306 is used in the digital modulator loop. This is followed by a 2-bit analog DAC 302 at the output of the loop to achieve the required digital-to-analog data conversion. The analog DAC 302 is followed by multiple stages of switched-capacitor (SC) filters and continuous-time (CT) filters to convert the digital DAC codes into a high linearity analog signal, and remove all high frequency noise. The various filters are collectively shown at block 304.

The 2-bit DAC 302 in this example has four codes, represented by +3, +1, −1 and −3. These codes are translated into an actual analog voltage by multiplying the codes by a reference voltage, hereinafter referred to as $V_{ref}$. The four example DAC codes are represented in Table 1 below. For purposes of Table 1, a practical value of 2.5V is used as the reference voltage $V_{ref}$, and the table shows the actual DC voltage levels based on this $V_{ref}$.

TABLE 1

| DAC CODE | ANALOG DC VOLTAGE | ANALOG DC VOLTAGE ($V_{ref}$ = 2.5 V) |
|---|---|---|
| +3 | +3 $V_{ref}$ | +7.5 V |
| +1 | +$V_{ref}$ | +2.5 V |
| −1 | −$V_{ref}$ | −2.5 V |
| −3 | −3 $V_{ref}$ | −7.5 V |

Such a 2-bit analog DAC 302 can be implemented using multiple sources of voltage, current, or charge elements. Multiple numbers of these elements are switched in response to incoming digital data to produce the effective DAC code within the DAC 302. Due to fabrication process limitations of current VLSI systems, these multiple elements have some inaccuracies relative to one another. These "mismatches" lead to data-dependent non-ideal characteristics in the output signal that are manifested as harmonic distortion. Depending on the degree of the mismatch, the amount of harmonic distortion in the output varies, and may be above the desirable level as in an HDSL2 application in which the present invention is applicable. The effects of analog component mismatch may be eliminated by replicating the analog DAC mismatches in the digital quantizer. This requires accurate measurement of the analog DAC DC codes (codes +3, +1, −1 and −3 in the example of Table 1), and appropriate modification of the digital quantizer.

In the embodiment described in connection with FIG. 3 and Table 1, the digital Δ-Σ modulator 300 is stable only for input signals being approximately 60% or less of $V_{ref}$. This translates to a peak analog voltage level of ±4.5V (i.e., 0.6×±7.5V). The Δ-Σ modulator 300 is able to meet this maximum peak signal by using certain densities of the four quantizer codes, switching them at high clock frequency. The transmit analog filters 304 are designed to operate at this peak analog signal level to maximize the dynamic range. Hence, it is not possible to pass the analog DAC 302 peak DC levels, such as ±7.5V shown in Table 1, through the analog filters 304. Some DC levels, such as ±7.5V, are also higher than the peak analog signal acceptable by certain on-chip components, such as an on-chip ADC used in one embodiment of the invention to measure these codes (described more fully below). Accordingly, DC measurement of these DAC codes is not a possible solution.

One possible manner in facilitating this measurement would be to change the value of the reference source to bring the peak DC signal into the appropriate analog processing range for calibration measurement. For example, the peak DAC code could be reduced from ±7.5V to ±4.5V for the purpose of calibration. This approach has at least two limitations. First, high precision D/A conversion requires very stringent noise requirements (including inherent thermal noise and switched circuit noise) on the voltage reference. Modifying this reference for calibration purposes can compromise the voltage reference specifications and adversely affect actual DAC code measurements. Second, the reference may be provided from an external source, in which case the value of this reference cannot be controlled. For at least these reasons, this option is not desirable.

The present invention involves a digital calibration technique that utilizes the actual reference source and the actual analog signal path without any modification. Instead of transmitting true DC DAC code levels, a higher frequency signal is transmitted. The DC component of the derived signal level has a one-to-one mapping to the actual DAC codes—with constant gain factor across all codes—and therefore can be used as a measure of the matching of the DAC codes. The high frequency content of the calibration signal is rejected as part of the measurement procedure.

The gain factor is implemented using modulation of digital data coming into the analog DAC. Instead of transmitting DC levels (i.e., a fixed DAC code) for each measurement, a digital data pattern is transmitted. This pattern uses a particular mix of matching pairs of DAC codes to create a gain factor less than one. In one embodiment, the matching pairs are +3 and −3 codes, and +1 and −1 codes. The calibration technique according to the invention is provided in greater detail below.

The circuit implementation is performed differentially. Therefore, to produce any DAC code, an equal number of positive and negative circuit elements are used (e.g., voltage, current or charge sources). In one embodiment, a reference voltage ($V_{ref}$) is used to charge a set of capacitors, thus converting voltage into charge packets. These charge packets are used to create various DAC codes. For purposes of illustration, assume that each charge packet is ideal, and is represented by $\Delta$. In a differential implementation of the DAC 302, the switching of one code implies a $\Delta_p$ charge packet used in the positive half circuit, and a $\Delta_n$ charge packet used in the negative half circuit, for a net differential charge transfer of ($\Delta_p - \Delta_n$). Table 2 below shows a 2-bit differential DAC implementation using such charge packets.

TABLE 2

| DAC CODE | NET CHARGE | NET CHARGE ($\Delta n = -\Delta p$) |
| --- | --- | --- |
| +3 | $3(\Delta p - \Delta n)$ | $6\Delta p$ |
| +1 | $(\Delta p - \Delta n)$ | $2\Delta p$ |
| −1 | $-(\Delta p - \Delta n)$ | $-2\Delta p$ |
| −3 | $-3(\Delta p - \Delta n)$ | $-6\Delta p$ |

The +3 and −3, and +1 and −1 groupings are called "matching pairs" because they are created using like circuit elements, just with opposite polarities.

In one implementation of the DAC codes of Table 2, three positive switching charge elements and three negative switching charge elements are used. Due to fabrication matching limits, these analog elements will not perfectly match. These elements are denoted in Table 3 below, where $\epsilon$ signifies a matching error in positive elements, and $\delta$ signifies a matching error in negative elements.

TABLE 3

| DAC ELEMENTS | CHARGE WITH MISMATCH ERROR | |
| --- | --- | --- |
| POSITIVE ELEMENT 1 | $\Delta p_1$ | $\Delta + \epsilon_1$ |
| POSITIVE ELEMENT 2 | $\Delta p_2$ | $\Delta + \epsilon_2$ |
| POSITIVE ELEMENT 3 | $\Delta p_3$ | $\Delta + \epsilon_3$ |
| NEGATIVE ELEMENT 1 | $\Delta n_1$ | $-\Delta - \delta_1$ |

TABLE 3-continued

| DAC ELEMENTS | CHARGE WITH MISMATCH ERROR | |
| --- | --- | --- |
| NEGATIVE ELEMENT 2 | $\Delta n_2$ | $-\Delta - \delta_2$ |
| NEGATIVE ELEMENT 3 | $\Delta n_3$ | $-\Delta - \delta_3$ |

As can be seen from Table 3, each DAC element is associated with a charge packet quantity $\Delta$, and is further associated with its respective matching error. For example, positive element 1 ($\Delta p_1$) can be characterized by $\Delta + \epsilon_1$, meaning its charge packet is offset by a matching error $\epsilon_1$ corresponding to a deviation from an ideal charge packet value. Its corresponding negative element, negative element 1, is characterized by $-\Delta - \delta_1$, meaning its negative charge packet is offset by a matching error $\delta_1$ corresponding to a deviation from its ideal charge packet value.

Table 4 below shows the effective values of the four DAC codes given the matching errors between charge packets used to create the DAC codes.

TABLE 4

| DAC CODE | NET CHARGE | |
| --- | --- | --- |
| +3 | $(\Delta p_1 + \Delta p_2 + \Delta p_3) - (\Delta n_1 + \Delta n_2 + \Delta n_3)$ | $6\Delta + (\epsilon_1 + \epsilon_2 + \epsilon_3 + \delta_1 + \delta_2 + \delta_3)$ + Offset |
| +1 | $(\Delta p_1 - \Delta n_1)$ | $2\Delta + (\epsilon_1 + \delta_1)$ + Offset |
| −1 | $-(\Delta p_1 - \Delta n_1)$ | $-2\Delta - (\epsilon_1 + \delta_1)$ + Offset |
| −3 | $-(\Delta p_1 + \Delta p_2 + \Delta p_3) + (\Delta n_1 + \Delta n_2 + \Delta n_3)$ | $-6\Delta - (\epsilon_1 + \epsilon_2 + \epsilon_3 + \delta_1 + \delta_2 + \delta_3)$ + Offset |

This particular DAC implementation illustrates that alternate addition of matching code pairs leads to a net charge of zero; i.e., the alternate transmission of the +3 and −3 code, or the +1 and −1 code results in a signal having no DC component. There will be high frequency signal content (approximately one-half the clock frequency if positive and negative codes are used alternately), however the high frequency signal content will be filtered by the transmit filters 304 following the DAC 302. Therefore, a variety of "effective" transmit DC levels can be created that are dependent on the density of codes used. The ratio of these DC levels remains the same as the ratio of the four DAC codes, and has the effect of measuring the actual DAC codes with a fixed gain factor. For calibration of the digital $\Delta$-$\Sigma$ modulator feedback quantizer, the actual gain is not critical—only the ratio of codes is important.

An example of one such data pattern is provided in Table 5 below, along with the DC component of the dynamic signal that it creates.

TABLE 5

| DAC CODE | STATIC DC LEVEL | DATA PATTERN | GAIN FACTOR AT DC | DYNAMIC DC LEVEL |
| --- | --- | --- | --- | --- |
| +3 | +7.5 V | −3 + 3 + 3 + 3 | 0.5 | +3.75 V |
| +1 | +2.5 V | −1 + 1 + 1 + 1 | 0.5 | +1.25 V |
| −1 | −2.5 V | +1 − 1 − 1 − 1 | 0.5 | −1.25 V |
| −3 | −7.5 V | +3 − 3 − 3 − 3 | 0.5 | −3.75 V |

As Table 5 illustrates, the use of such a data pattern provides a manner of obtaining a gain factor less than one, thereby causing the dynamic DC level to be less than the static DC level. As will be appreciated by those skilled in the art from the foregoing description, the dynamic DC level can be modified by changing the number of available matching pairs, and/or by changing the data pattern while maintaining a constant gain factor across all codes. For example, the data pattern could be modified to replicate the last data pattern segment for each code, such that the data pattern for the +3 code was −3, +3, +3, +3, +3. In this case, the gain factor would be changed to 0.6, and the dynamic DC level would be +4.5V, in which case the effective signal is provided every three out of five clock cycles/pulses. The data pattern illustrated in Table 5 has a DC gain of 0.5, because the effective signal is provided every two out of four clock cycles/pulses.

Besides the DC component, there is high frequency component at ¼th the clock rate for the example provided in Table 5. This high frequency component is removed sufficiently from the measurement so that an accurate DC measurement can be performed for calibration purposes. Part of this high frequency content is removed by transmit analog filters 304, which are used for removing the high frequency noise of the digital Δ-Σ modulator itself. The remainder of the noise is filtered out by a receive decimation filter, which is logically located after a receive A/D used for the measurement purpose. This is more fully described in connection with FIGS. 4 and 5 below.

Figure 4:
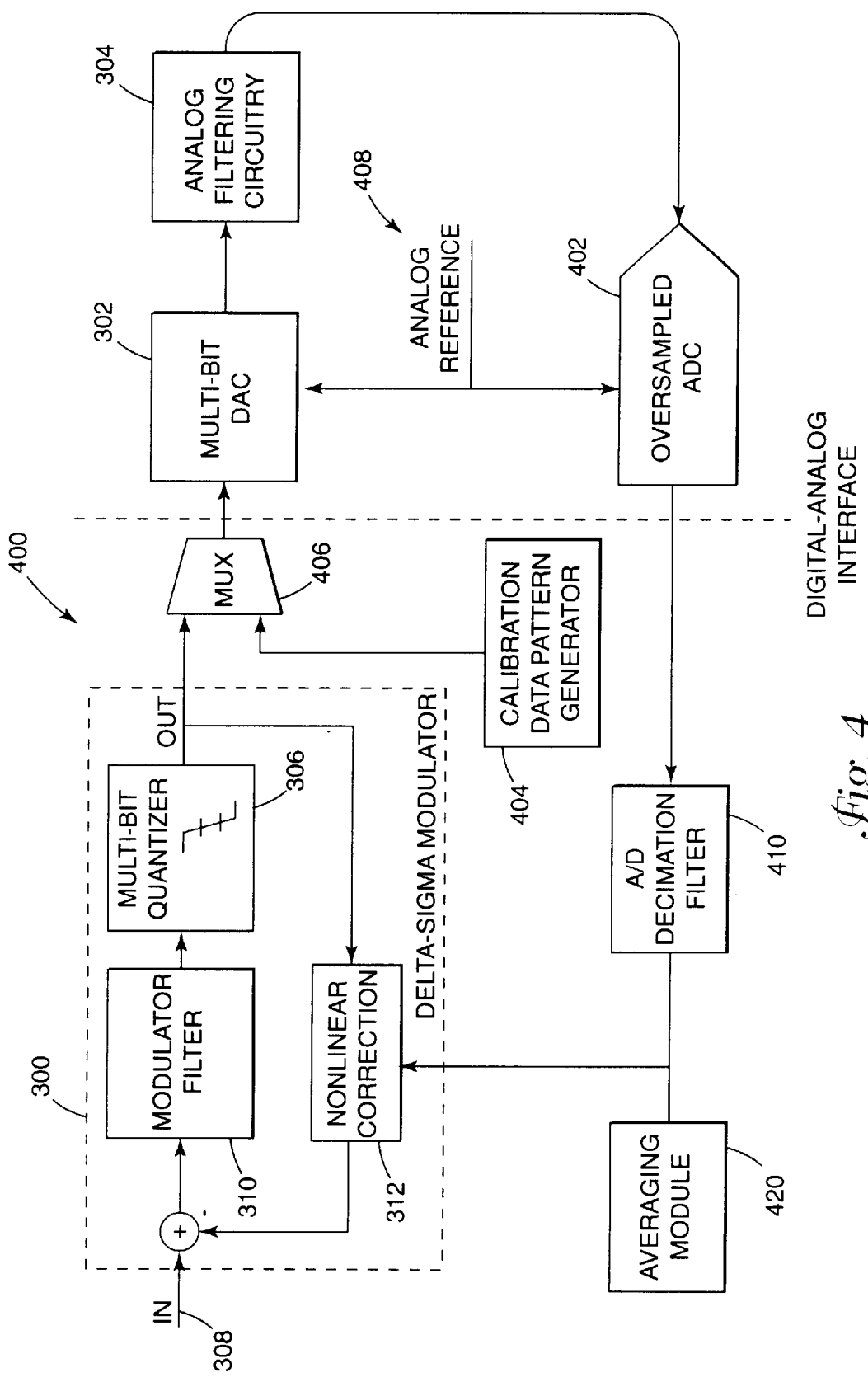
FIG. 4 is a block diagram of one embodiment of an apparatus for calibrating a multi-bit digital $\Delta$-$\Sigma$ modulator in accordance with the present invention.

Referring now to FIG. 4, one embodiment of an apparatus 400 for calibrating a multi-bit digital Δ-Σ modulator in accordance with the present invention is provided. The portion of the transmit path described in connection with FIG. 3 is also shown in FIG. 3, including the Δ-Σ modulator 300, analog multi-bit DAC 302, analog filters 304, multi-bit quantizer 306, modulator filter 310 and nonlinear correction circuitry 312.

In order to perform the calibration in accordance with the present invention, the output of the analog filtering circuitry 304 is connected to a measurement device, which in one embodiment of the invention is an oversampled ADC 402 that converts the analog signals into digital form. A particular DAC code is selected for measurement (e.g., +3 code) and the calibration data pattern generator 404 is initiated. The calibration data pattern generator 404 generates the predetermined data patterns associated with each of the DAC codes, as previously illustrated in Table 5. The multiplexer 406 allows passage of the data pattern to the multi-bit DAC 302 in response to control signals (not shown). The multi-bit DAC 302 converts the digital data patterns to the dynamic DC levels previously described, and the analog filtering circuitry 304 filters out the high frequency noise generated by the generation of the data pattern. The resulting analog signal is converted to digital signals at the ADC 402, which receives its voltage reference from the same analog voltage reference $V_{ref}$ 408 that is used for the multi-bit DAC 302. The output of the ADC 402 is provided to the A/D decimation filter 410, where any remaining noise is filtered out. The filtered digital signals, i.e., the measured DAC codes, are then ultimately used to replace the codes in the 2-bit digital quanitizer 306 to effect the calibration. While this can be accomplished by directly replacing the codes in the 2-bit digital quantizer 306 with the measured "effective" codes, in a preferred embodiment an averaging module 420 is provided to allow a plurality of samples to be taken so that an average effective code can be used. Any hardware or software device capable of collecting a predetermined number of samples and calculating the average value of these samples may be used. For example, a processor operating under the control of software or firmware could be used.

To perform this calibration successfully, the ADC 402 used in this measurement should be accurate to the desired level of the DAC code measurement. This will not be of concern, since the ADC 402 can be selected to have more stringent requirements than the on-chip DAC 302. Also the DC offset of the ADC 402 is calibrated out before performing this measurement so that the A/D offset voltage does not get added to the calibrated transmit DC signals. The DC offset of the transmit blocks used in the measurement path is added equally to all of the measured DAC codes, and is separated from the measured DAC codes by the digital non-linear correction block 312. The measured DAC codes and offset voltage are reflected in the corrected digital quantizer 306 of the Δ-Σ modulator 300. Hence, the use of this digitally calibrated Δ-Σ modulator with the associated analog DAC and other circuits eliminates DAC mismatch-based non-linearities and DC offset from the signal path.

The connection path between analog transmit path (the output of the analog filtering circuitry) and the receive ADC 402 can be selected wherever desirable and convenient, based on the degree of necessary DC offset cancellation and on circuit design convenience. In one particular implementation, the connection from the analog transmit path is made at the output of the switched-capacitor filters 220 (shown in FIG. 2), however it can also be made after the output buffer 230 (also shown in FIG. 2).

Figure 5:
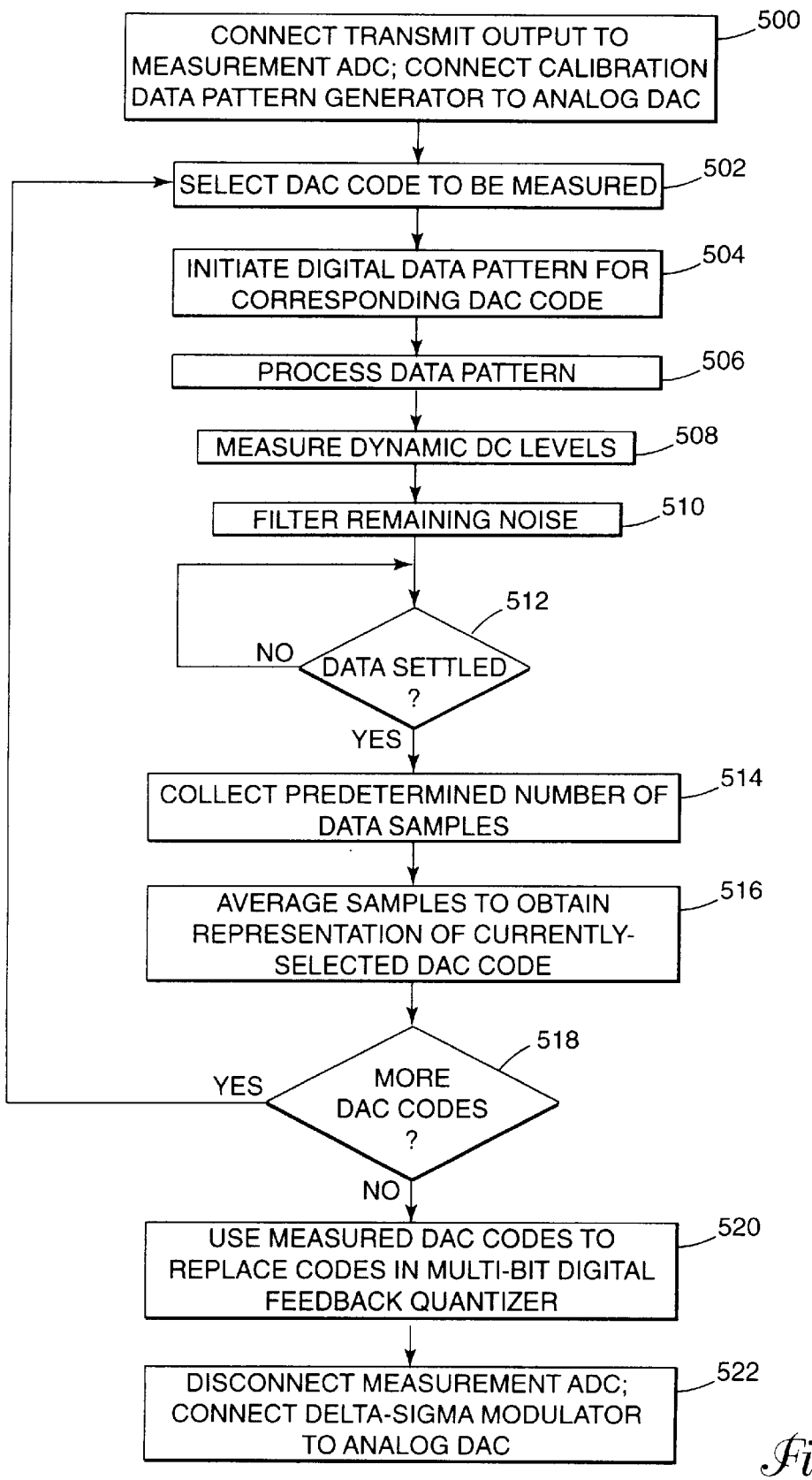
FIG. 5 is a flow diagram illustrating one embodiment of a calibration method in accordance with the principles of the present invention.

FIG. 5 is a flow diagram illustrating one embodiment of a calibration method in accordance with the principles of the present invention. The embodiment of FIG. 5 also makes reference to elements in FIG. 4 to provide illustrative examples where necessary. It should be noted that reference to the particular components of FIG. 4 is made to provide an example of how such a method may be effected, however, the method according to FIG. 5 is clearly not limited to implementation by the components depicted in FIG. 4.

To setup the calibration process, a connection is made from the analog transmit path to the measurement circuitry, and the calibration data pattern generator is connected to the analog DAC. A particular manner of performing these functions is illustrated at block 500, where the analog transmit path from the analog filtering circuitry 304 is connected to the measurement ADC 402, and the calibration data pattern generator 404 is connected to the multi-bit DAC 302 via the multiplexer 406. Each of the DAC codes are to be measured, and a first of the DAC codes is selected 502 for measurement. A predetermined digital data "pattern" associated with the selected DAC code is initiated 504. The data pattern is processed 506, for example by the multi-bit DAC 302 and the analog filtering circuitry 304 to provide the analog transmit signal. This analog signal is then fed to a measurement circuit, such as the ADC 402, where the dynamic DC levels are measured as shown at block 508. Any remaining noise or high frequency content is removed by filtering 510. This can be accomplished, for example, using an A/D decimation filter 410 as shown in FIG. 4.

The measured data may immediately be collected, or alternatively may be subjected to a delay to allow the data to settle to a substantially stable DC level. In one embodiment of the invention, this is accomplished by discarding a first predetermined number of the data samples collected. In still a more specific embodiment, the first 128 post-decimation samples are discarded in order to allow the data to settle to a final desired DC level, which removes the effects of DAC code transitions from the DC measurement. The process is temporarily suspended until the data has settled, as illustrated by the feedback loop at decision block 512.

When the data has settled, a predetermined number of filtered data samples is collected 514. In one embodiment of the invention, the data samples are taken from the output of the A/D decimation filter 410 so that the data samples are adequately filtered. The predetermined number of valid, collected data samples are averaged 516 to obtain a corresponding representation of the currently selected DAC code. In one embodiment, the next 2048 samples (following the first 128 unused data samples resulting from the data settling period) are collected as the predetermined number of valid data samples. This process continues as long as there are more DAC codes to be analyzed, as evidenced by the return path from decision block 518 to block 502.

When all of the effective DAC codes have been measured in accordance with the invention, the measured DAC codes are used to replace the original DAC codes in the multi-bit digital feedback quantizer as shown at block 520. The system is thus calibrated when the original DAC codes are replaced with the measured DAC codes. As depicted at block 522, the calibration circuitry can be disconnected by disconnecting the measurement circuitry (e.g., the ADC 402) and connecting the Δ-Σ modulator 300 to the analog DAC 302 via the multiplexer 406.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method for calibrating a multi-bit feedback quantizer in a delta-sigma modulation system used to transmit analog signals in a transmit channel, comprising:

transmitting a digital data pattern corresponding to a particular DAC code of a multi-bit digital-to-analog converter in the transmit channel, wherein the DAC code is proportional to an analog voltage signal;

realizing an effective DC component of the digital data pattern;

converting the effective DC component values from the multi-bit digital-to-analog converter to corresponding digital DC component values;

averaging a predetermined number of samples of the digital DC component values to provide an average sample value; and replacing a digital code in the multi-bit feedback quantizer with the average sample value.

2. The method of claim 1, wherein replacing the digital code in the multi-bit feedback quantizer with the average sample value provides a calibrated value proportional to the original analog voltage signal associated with the DAC code.

3. The method of claim 1, wherein a different digital data pattern is provided for each of the DAC codes associated with the multi-bit digital-to-analog converter.

4. The method of claim 1, further comprising modifying the effective DC component value by modifying values of codes in the digital data pattern.

5. The method of claim 1, further comprising modifying the effective DC component value by modifying a number of codes in the digital data pattern.

6. The method of claim 1, further comprising modifying the effective DC component value by modifying a reference voltage in the digital-to-analog converter.

7. The method of claim 1, wherein transmitting a digital data pattern comprises transmitting a predetermined digital data pattern of matching pairs of the DAC codes.

8. The method of claim 7, wherein each of the matching pairs of the DAC codes represent corresponding positive and negative circuit charge packets.

9. The method of claim 1, wherein transmitting a digital data pattern comprises generating a plurality of codes representative of its corresponding digital data pattern.

10. The method of claim 1, wherein realizing an effective DC component of the digital data pattern comprises filtering the digital data pattern.

11. The method of claim 1, wherein the effective DC component values have a gain of less than one with reference to the analog voltage signals corresponding to their respective DAC codes.

12. The method of claim 1, further comprising filtering out a frequency component corresponding to a frequency of the digital data pattern.

13. The method of claim 12, further comprising filtering noise signals from the digital DC component values.

14. The method of claim 1, wherein averaging a predetermined number of samples of the digital DC component values comprises summing the predetermined number of samples of the digital DC component values and dividing by the predetermined number of samples taken to obtain an equivalent representation of the DAC code.

15. The method of claim 14, further comprising discarding a first collection of the samples to allow the digital DC component values to settle to a substantially stable level prior to summing the predetermined number of samples.

16. A calibration apparatus for calibrating a multi-bit digital delta-sigma modulator having a multi-bit feedback quantizer in the modulation loop, comprising:

a multi-bit digital-to-analog converter having associated DAC codes proportional to an analog voltage signal;

a calibration data pattern generator to generate a unique digital data pattern of codes having an analog DC component representative of each of the DAC codes;

an analog-to-digital converter coupled to the multi-bit digital-to-analog converter to convert the analog DC component to a corresponding digital DC component value, wherein the digital DC component value replaces a digital code in the multi-bit feedback quantizer with the digital DC component value; and wherein the analog DC component derived from the digital data pattern of codes is proportional to the analog voltage signals of its corresponding DAC code, and has a constant gain factor across all DAC codes of less than one.

17. The calibration apparatus as in claim 16, further comprising an averaging module to collect a predetermined number of samples of the digital DC component values and to calculate an average digital DC component value to be used to replace the digital code in the multi-bit feedback quantizer.

18. The calibration apparatus as in claim 16, further comprising analog filtering circuitry coupled at an output of the multi-bit digital-to-analog converter to remove a frequency component corresponding to a frequency of the calibration data pattern.

19. The calibration apparatus as in claim 18, further comprising a decimation filter coupled to the analog-to-digital converter to filter out noise signals from the digital DC component values.

20. The calibration apparatus as in claim 16, further comprising a multiplexer coupled to the delta-sigma modulator and to the calibration data pattern generator to selectively transmit the digital data pattern to the multi-bit digital-to-analog converter upon recognition of a calibration control signal.

21. The calibration apparatus as in claim 16, wherein the multi-bit digital-to-analog converter is a two-bit multi-bit digital-to-analog converter.

* * * * *